(12) United States Patent
Nöthlings et al.

(10) Patent No.: US 7,225,214 B2
(45) Date of Patent: May 29, 2007

(54) DIGITAL FILTER REALIZATION

(75) Inventors: Rolf Nöthlings, Stuttgart (DE); Jens Wildhagen, Weinstadt (DE)

(73) Assignee: Sony Deutschland GmbH, Cologne (DE)

( * ) Notice: Subject to any disclaimer, the term of this patent is extended or adjusted under 35 U.S.C. 154(b) by 928 days.

(21) Appl. No.: 10/260,627

(22) Filed: Sep. 27, 2002

(65) Prior Publication Data

US 2003/0065693 A1   Apr. 3, 2003

(30) Foreign Application Priority Data

Sep. 28, 2001   (EP) .................................. 01123468

(51) Int. Cl.
*G06F 17/10* (2006.01)
(52) U.S. Cl. ..................................... 708/319
(58) Field of Classification Search ............... 708/313, 708/319
See application file for complete search history.

(56) References Cited

U.S. PATENT DOCUMENTS

| | | | |
|---|---|---|---|
| 3,930,147 A | 12/1975 | Bellanger et al. | |
| 4,779,128 A | 10/1988 | Johannes et al. | |
| 5,040,137 A * | 8/1991 | Sherrill | 708/319 |
| 5,079,734 A * | 1/1992 | Riley | 708/313 |
| 5,594,675 A | 1/1997 | Peng | |
| 5,777,912 A * | 7/1998 | Leung et al. | 708/319 |
| 6,505,221 B1 * | 1/2003 | Maschmann | 708/306 |

FOREIGN PATENT DOCUMENTS

| | | |
|---|---|---|
| DE | 31 11 889 | 10/1982 |
| EP | 0 774 835 | 5/1997 |
| EP | 0 977 359 | 2/2000 |

* cited by examiner

*Primary Examiner*—Chuong D. Ngo
(74) *Attorney, Agent, or Firm*—Oblon, Spivak, McClelland, Maier & Neustadt, P.C.

(57) ABSTRACT

A digital filter realization is proposed that consists of only one multiplier, i. e. which operates with a higher clock rate and changes coefficient at the multiplier each clock cycle, but in which the clock rate of the multiplier is reduced in comparison to prior art filters by considering equal filter coefficients, e. g. based on the symmetry of FIR filter coefficients. According to the present invention preferably the samples belonging to equal filter coefficients are added in advance in order to reduce the number of multiplications, which concludes in a reduced clock rate for the filter, a reduced needed calculation power, and therefore a reduced power consumption.

10 Claims, 3 Drawing Sheets

US 7,225,214 B2

DIGITAL FILTER REALIZATION

BACKGROUND OF THE INVENTION

This invention relates to the realization of a digital filter, in particular to the realization of a digital FIR filter of order N which comprises a modified digital filter of order 1 operating with a higher sampling rate. Further, the invention relates to a method to filter a M-times multiplexed input signal with such a digital FIR filter.

A digital filter of order 2N which receives a M-times multiplexed input signal which comprises a modified filter of order 1 in which 2N filter coefficients get periodically switched with a clock frequency that equals to M·2N-times the sampling rate of the input signal to set the filter periodically into M·2N internal filter states in each of which an internal output value is calculated before outputting one complete sample of the M-times multiplexed output signal is described in the European Patent Application EP 98 114 111.2 of the Applicant which content is herewith incorporated into this specification.

A special cost effective realization of such a filter is described in the Applicant's European Patent Application "Memory and Gate Effect Realization of a Digital Filter" which content is herewith incorporated into this specification.

These both documents show digital filters, preferably IIR filters, which have a clock frequency that equals to the sampling rate·number of multiplexes·filter order. Therefore, depending on the input signal and the wanted filter order it might be necessary to operate the respective filter with a comparatively high clock rate which results in a high needed processing power on the chip on which the filter is realized.

Therefore, it is the object underlying the present invention to provide an enhanced digital filter and method to filter a M-times multiplex input signal with a digital filter which require a reduced calculation power.

SUMMARY OF THE INVENTION

The digital FIR filter of order N receiving a M-times multiplexed input signal with a predetermined sampling rate and outputting a M-times multiplexed output signal with said predetermined sampling rate according to the present invention comprises: a combining unit which receives the input signal, holds the last N input signal samples of each input signal multiplex, at least combines at least two of the last N received input signal samples of the input signal multiplex which comprises the input sample actually supplied to the FIR filter which have to be subjected to equal filter coefficients, and outputs a combined output signal comprising all not combined input signal samples of the last N received input signal samples of the input signal multiplex which comprises the input sample actually supplied to the FIR filter and all combined input signal samples thereof during the time in which the actual input sample is supplied to the digital filter; one multiplier receiving the combined output signal and multiplying each sample thereof with a respective corresponding filter coefficient; and one integrator receiving the multiplied samples of the combined output signal, integrating them during a first time period in which the actual input sample is supplied to the FIR filter, and providing the actual output sample at the end of said first time period.

Therewith, according to the present invention a FIR filter is realized which needs only a reduced calculation power taking advantage of the symmetrie of the impulse response of FIR filters.

Preferably, in the digital filter according to the present invention, for even N said combining unit combines the first N/2 of the last N received input signal samples of the input signal multiplex which comprises the input sample actually supplied to the FIR filter in the order of reception with the last N/2 of the last N received input signal samples of the input signal multiplex which comprises the input sample actually supplied to the FIR filter in time inverted order of reception.

Alternatively or additionally, in the digital filter according to the present invention, for odd N said combining unit combines the first (N−1)/2 of the last N received input signal samples of the input signal multiplex which comprises the input sample actually supplied to the FIR filter in the order of reception with the last (N−1)/2 of the last N received input signal samples of the input signal multiplex which comprises the input sample actually supplied to the FIR filter in time inverted order of reception, and doubles the (N+1)/2 sampling value.

Of course, the order of combination of the input samples can also be time inverted together with the provision of the coefficients in the respective corresponding order.

Therefore, in the digital filter according to the above described embodiments of the present invention, said combining unit preferably comprises a first buffer which receives the input signal and outputs each of the second half of the last N received input samples of each input signal multiplex in the time inverted order of reception during the time in which the actual input sample is supplied to the FIR filter, a second buffer which receives the input signal and outputs each of the first half of the last N received input samples of each input signal multiplex in the order of reception during the time in which the actual input sample is supplied to the FIR filter, and a first adder (3) receiving and adding the simultaneously output samples of the first and second buffer to output a respective sample of the combined output signal. In this notation the first half of the last N received input samples means the first N/2 samples for even N and the first (N+1)/2 samples for odd N. Further, the second or last half of the last N received input samples means the last N/2 samples for even N and the last (N+1)2 samples for odd N; the second half includes the newest (actually supplied) sample. Therefore, in case of odd N the middle sample, i.e. the sample (N+1)/2 is doubled.

In this embodiment, said first buffer preferably comprises: a first switch receiving the input signal at a first fixed terminal and providing the output samples of the first buffer at a variable terminal thereof, a first delay element connected to said variable terminal of said first switch and providing delayed input samples to the second buffer, and a second delay element connected to the output of the first delay element and providing further delayed input samples to a second fixed terminal of said first switch, and said second buffer preferably comprises: a second switch receiving the delayed input samples at a first fixed terminal and providing the output samples of the first buffer at a variable terminal thereof, a third delay element connected to a variable terminal of said second switch and providing the output samples of the second buffer which are additionally supplied to a second fixed terminal of said second switch, wherein said variable terminal of said first switch and said variable terminal of said second switch are connected to the respective first fixed terminal during a second time period for loading a new input signal sample and are connected to the respective second fixed terminal during a third time period to calculate and output said combined output signal.

Further, in the digital filter according to the above described embodiments of the present invention, said integrator preferably comprises: a second adder receiving the multiplied samples of the combined output signal as respective first summands and providing the actual output sample at the end of said first time period, a fourth delay element receiving to the output signal of said second adder, and a third switch which variable terminal provides respective second summands to the second adder, which receives a zero signal at a first fixed terminal and the delayed output signal of said second adder at a second fixed terminal, wherein said variable terminal of said third switch is connected to the first fixed terminal during a second time period for loading a new input signal sample and is connected to the respective second fixed terminal during a third time period to calculate and output said actual output sample.

The method to filter a M-times multiplexed input signal with a digital filter of order N which comprises a modified FIR filter of order 1 operating with a higher sampling rate according to the present invention comprises the steps of: holding the last N input signal samples of each input signal multiplex, at least combining at least two of the last N received input signal samples of the input signal multiplex which comprises the input sample actually supplied to the FIR filter which have to be subjected to equal filter coefficients, multiplying each not combined and each combined input signal sample with a respective corresponding filter coefficient, and integrating the multiplied samples during a first time period in which the actual input sample is supplied to the FIR filter, and providing the actual output sample at the end of said first time period.

In the method according to the present invention, preferably for even N the first N/2 of the last N received input signal samples of the input signal multiplex which comprises the input sample actually supplied to the FIR filter in the order of reception are combined with the last N/2 of the last N received input signal samples of the input signal multiplex which comprises the input sample actually supplied to the FIR filter in time inverted order of reception.

Alternatively or additionally, in the method according to the present invention, preferably for odd N the first (N−1)/2 of the last N received input signal samples of the input signal multiplex which comprises the input sample actually supplied to the FIR filter in the order of reception are combined with the last (N−1)/2 of the last N received input signal samples of the input signal multiplex which comprises the input sample actually supplied to the FIR filter in time inverted order of reception, and the (N+1)/2 sampling value is doubled.

Further alternatively or additionally in the method according to the present invention, preferably said combining comprises an adding of corresponding input signal samples.

A computer program product according to the present invention comprises computer program means adapted to embody the digital filter as defined in anyone of the above embodiments of the present invention when said computer program product is executed on a computer, digital signal processor or the like.

Further, a computer program product according to the present invention comprises computer program means adapted to carry out the method steps as defined in anyone of the above embodiments of the present invention when said computer program product is executed on a computer, digital signal processor or the like.

Therefore, according to the present invention, a digital filter realization is proposed that consists of only one multiplier, i. e. which operates with a higher clock rate and changes coefficient at the multiplier each clock cycle, but in which the clock rate of the multiplier is reduced in comparison to prior art filters by considering equal filter coefficients, e. g. based on the symmetry of FIR filter coefficients. According to the present invention preferably the samples belonging to equal filter coefficients are added in advance in order to reduce the number of multiplications, which concludes in a reduced clock rate for the filter, a reduced needed calculation power, and therefore a reduced power consumption.

In such a particular preferred embodiment of a digital filter according to the present invention which might realize a digital FIR filter, the symmetry of FIR filter coefficients can easily be considered. As defined in general terms above, two ring buffers are supplied to provide the right samples at the right time. Both store "about half" of the needed samples for the filter coefficients. To take advantage of the symmetry and provide the right samples rotating in the buffer, one of the ring buffers provides the samples in "time inverted" order.

The storage of "about half" of the needed samples for the filter coefficients is to be understood in the sense that in case of an even filter order N, i. e. an even number N of filter coefficients, each of the buffers provides N/2 samples, one in the order of reception, i. e. the first sample, the second sample, the third sample, . . . , the $N/2^{th}$ sample, and the other in time inverted order, i. e. the $N^{th}$ sample, the $(N/-1)^{th}$ sample, . . . , the $(N/2+1)^{th}$ sample. However, in case of an odd filter order N, i. e. of an odd number N of filter coefficients, each of the buffers stores (N+1)/2 samples of the input signal so that the $(N+1)/2^{th}$ sample is stored in both buffers, i. e. the buffer storing the samples in the order of reception provides the first sample, the second sample, the third sample, . . . , the $(N+1)/2^{th}$ sample, and the buffer storing the samples in time inverted order stores and outputs the $N^{th}$ sample, the $(N-1)^{th}$ sample , . . . , the $(N+1)/2^{th}$.

Due to this technique, a particular easy realization for both cases, i. e. even and odd filter order N is achieved under consideration that the $(N+1)/2^{th}$ filter coefficient has to be divided by 2 in case of an odd filter order N.

Further features and advantages of the digital filter and the method to filter a M-times multiplexed input signal with a digital filter according to the present invention will become apparent from the following description of exemplary embodiments thereof taken in conjunction with the accompanying figures, in which:

DETAILED DESCRIPTION OF THE INVENTION

In the following exemplary preferred embodiments of digital filters according to the present invention are described. Since digital filters used e. g. in digital receivers are often realized on an ASIC, it is wishful to make the filter circuits as small as possible to reduce the costs. This means, that the filters should be realized with as few elements as possible.

Therefore, the exemplary preferred embodiments of digital FIR filter realizations comprise only one multiplier to realize a FIR filter of order N. Similar to the realizations of the above-identified European Patent Applications which content is included into this specification by reference, the realization of a FIR filter of order N with one multiplier is based on the usage of a higher clock rate for the actual filter and a provision of the filter coefficients in a special order at the multiplier. Further, according to the present invention calculation power requirements in respect to a needed clock rate are reduced due to the combining of samples subjected to equal filter coefficients.

According to the described preferred embodiments of the present invention which only consider the symmetry of FIR filter coefficients, the clock rate for a filter of odd order N is $(N+1)/2 \cdot f_s \cdot M$, with $f_s$ being the sampling rate of the input signal and M being the number of multiplexes of the input signal. In case of an even filter order N the clock rate is $N/2 \cdot f_s \cdot M$.

Since the symmetry of a FIR filter is used to reduce the number of multiplications, two ring buffers are used to provide the right samples at the right time. One of the ring buffers provides the samples in receiving order and the other provides the samples in time inverted order. Then, the samples which have to be applied to symmetric coefficients are added in advance to reduce the number of multiplications corresponding samples. To avoid an overflow, preferably the input samples are rescaled.

After the added samples are subjected to their filter coefficients, i. e. multiplied by the respective filter coefficient, an integrator which gets initialized for each new output sample builds the sum of the $(N+1)/2$ in case of an odd filter order N and $N/2$ in case of an even filter order N combined and weighted input samples.

Figure 1:
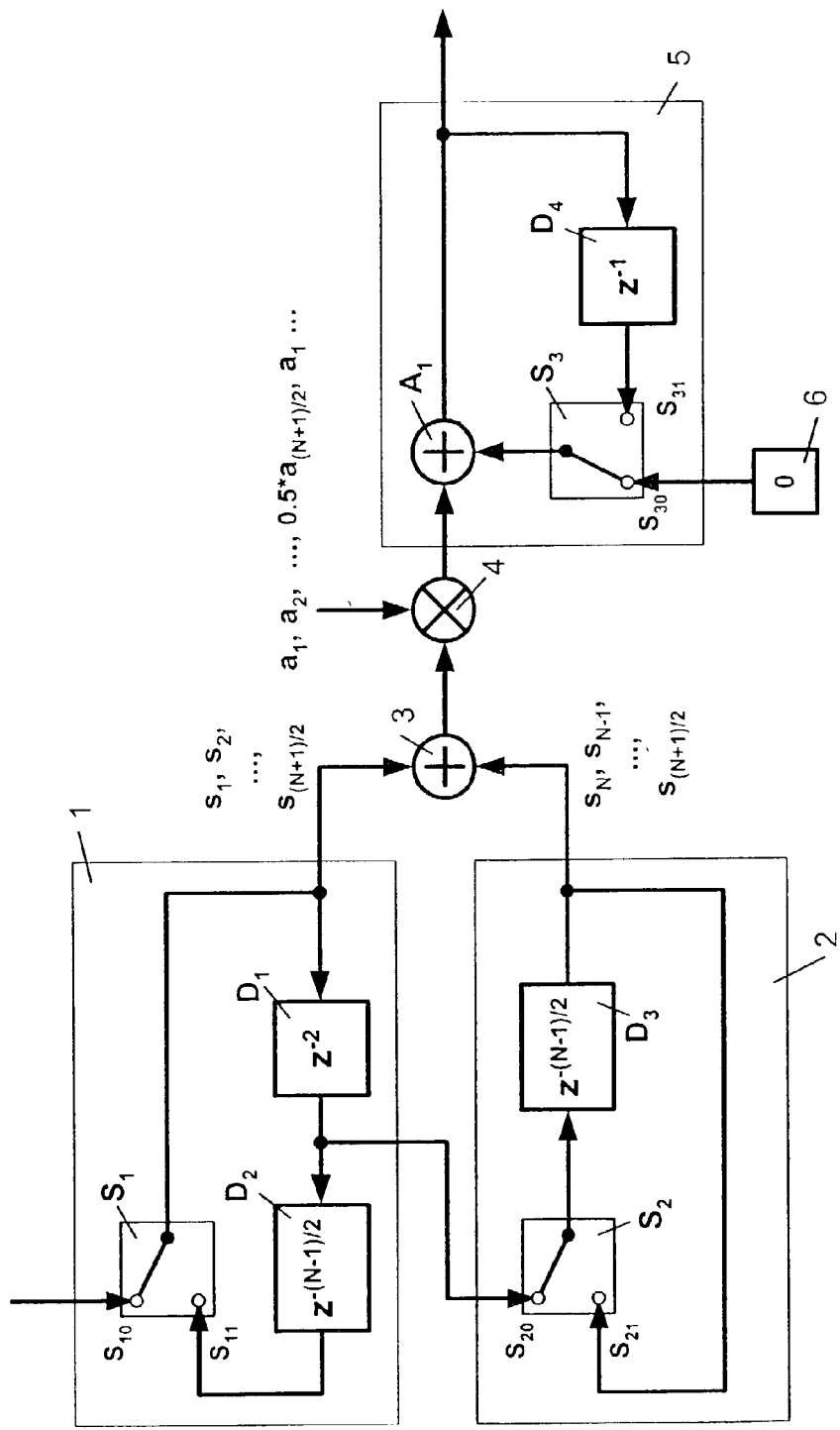
FIG. 1 shows a block diagram of a digital FIR filter realization according to the present invention for a filter of odd filter order.

FIG. 1 shows a block diagram of the FIR filter structure according to the present invention for a filter of odd filter order N.

The input signal which is not multiplexed is supplied to a combining unit comprising a first ring buffer 1, a second ring buffer 2, and an adder 3 which holds at least the last N received input samples, combines them so that input samples which have to be subjected to equal filter coefficients based on the FIR filter coefficient symmetry are added, and provides the last N combined input samples, i. e. $(N+1)/2$ input samples, during the time at which the actual input sample is supplied to the whole FIR filter to the multiplier 4 which correspondingly switches $(N+1)/2$ filter coefficients to perform a respective weighting of the combined input samples. All $(N+1)/2$ combined and weighted input samples are fed to an integrator 5 at which output the correspondingly filtered input signal is available after all $(N+1)/2$ combined and weighted input samples are added.

The first ring buffer 1 comprises a first switch $S_1$ which receives the input signal at its first fixed terminal $S_{10}$ and supplies the output signal of the first ring buffer 1 to the adder 3 at its variable terminal. This output signal is also input to a first delay element $D_1$ with a delay of 2 clock cycles which supplies its output signal to the input of the second ring buffer 2 and to a second delay element $D_2$ of the first ring buffer 1 with a delay $(N-1)/2$. The second delay element $D_2$ supplies its output signal to the second fixed terminal $S_{11}$ of the first switch $S_1$.

The second ring buffer 2 comprises a second switch $S_2$ which receives the input signal of the second ring buffer 2 at its first fixed terminal $S_{20}$ and supplies the input signal of a third delay element $D_3$ at its variable terminal. The third delay element $D_3$ has a delay $(N-1)/2$ and supplies the output signal of the second ring buffer 2 to the first adder 3. The output signal of the third delay element $D_3$ is further input to the second fixed terminal $S_{21}$ of the second switch $S_2$.

The first adder 3 adds the output signal of the first ring buffer 1 and the output signal of the second ring buffer 2 and supplies a combined output signal to the multiplier 4. The output signal of the first ring buffer 1 comprises the second half of the last N input samples in time inverted order, i. e. $S_1, S_2, \ldots, S_{(N+1)/2}$. The output signal of the second ring buffer 2 supplies the first half of the last N input samples in their incoming order, i. e. $S_N, S_{N-1}, \ldots, S_{(N+1)/2}$. In this notation $S_1$ is the newest sample, i.e the sample actually supplied to the combining unit, i.e. the first ring buffer 1, and the sample $S_N$ is the oldest sample considered for the current filtering process.

The multiplier 4 weights each of the samples of the combined output signal with a corresponding filter coefficient $a_1, a_2, \ldots, a_{(N-1)/2}$, and—since the middle sample of the odd N input samples, i. e. the sample $S_{(N+1)/2}$ is doubled—this middle sample is weighted with a filter coefficient $a_{(N+1)/2}$ which is divided by 2. All weighted samples of the combined output signal which correspond the actual FIR filter supplied input sample are integrated by the integrator 5. The integrator 5 comprises a second adder $A_1$ which receives the output signal from the multiplier 4 as a first summand and supplies the actual output sample of the FIR filter at the end of its integrating period at its output. The output of the second adder $A_1$ is supplied to a fourth delay element $D_4$ with a delay of one clock cycle which supplies its output signal to the second fixed terminal of a switch $S_3$. The variable terminal of the switch $S_3$ supplies the second summand to the second adder $A_1$. The first fixed terminal of the third switch $S_3$ is connected to a zero signal 6.

All three switches $S_1$, $S_2$, $S_3$ are switched to their first fixed terminal $S_{10}, S_{20}, S_{30}$ in the first clock cycle. Here, the first switch $S_1$ loads the new input sample, the second switch $S_2$ takes over one input sample from the first ring buffer 1 to the second ring buffer 2, and the third switch $S_3$ initializes the integrator 5. From the second cycle they are switched to their respective second fixed terminal $S_{11}, S_{21}, S_{31}$ until one output sample of the FIR filter is determined and the next input sample is needed.

Figure 2:
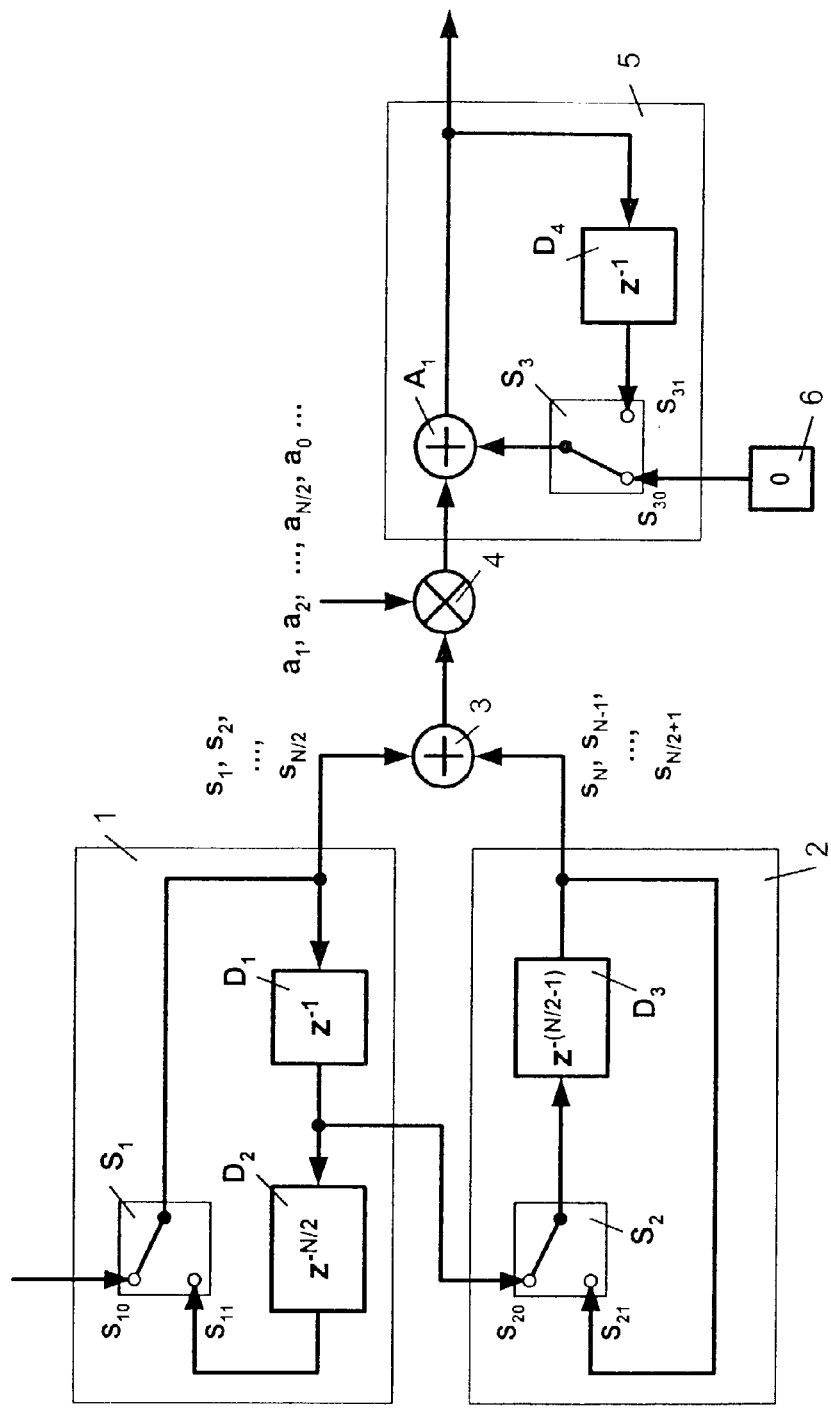
FIG. 2 shows a block diagram of a digital FIR filter realization according to the present invention for a filter of even filter order.

FIG. 2 shows the block diagram of the FIR filter structure according to the present invention for a filter of even filter order N for an input signal which is not multiplexed, i. e. comprises only one multiplex. Basically, the filter structure is equal to that of the FIR filter shown in FIG. 1. Only the delays of the first, second and third delay elements $D_1, D_2, D_3$ are different. For an even filter order N the first delay element $D_1$ only provides a delay of one clock cycle, the second delay element $D_2$ provides a delay of $N/2$ clock cycles, and the third delay element $D_3$ provides a delay of $N/2-1$ clock cycles. Therefore, the first ring buffer outputs the samples $S_1, S_2, \ldots, S_{N/2}$, and the second ring buffer 2 outputs the samples $S_N, S_{N-1}, \ldots, S_{N/2+1}$.

Further, since no middle sample exists as in the case for an odd filter order N, the multiplier 4 switches through the filter coefficients $a_1, a_2, \ldots, a_{N/2}$ without having to divide one of the filter coefficients.

Figure 3:
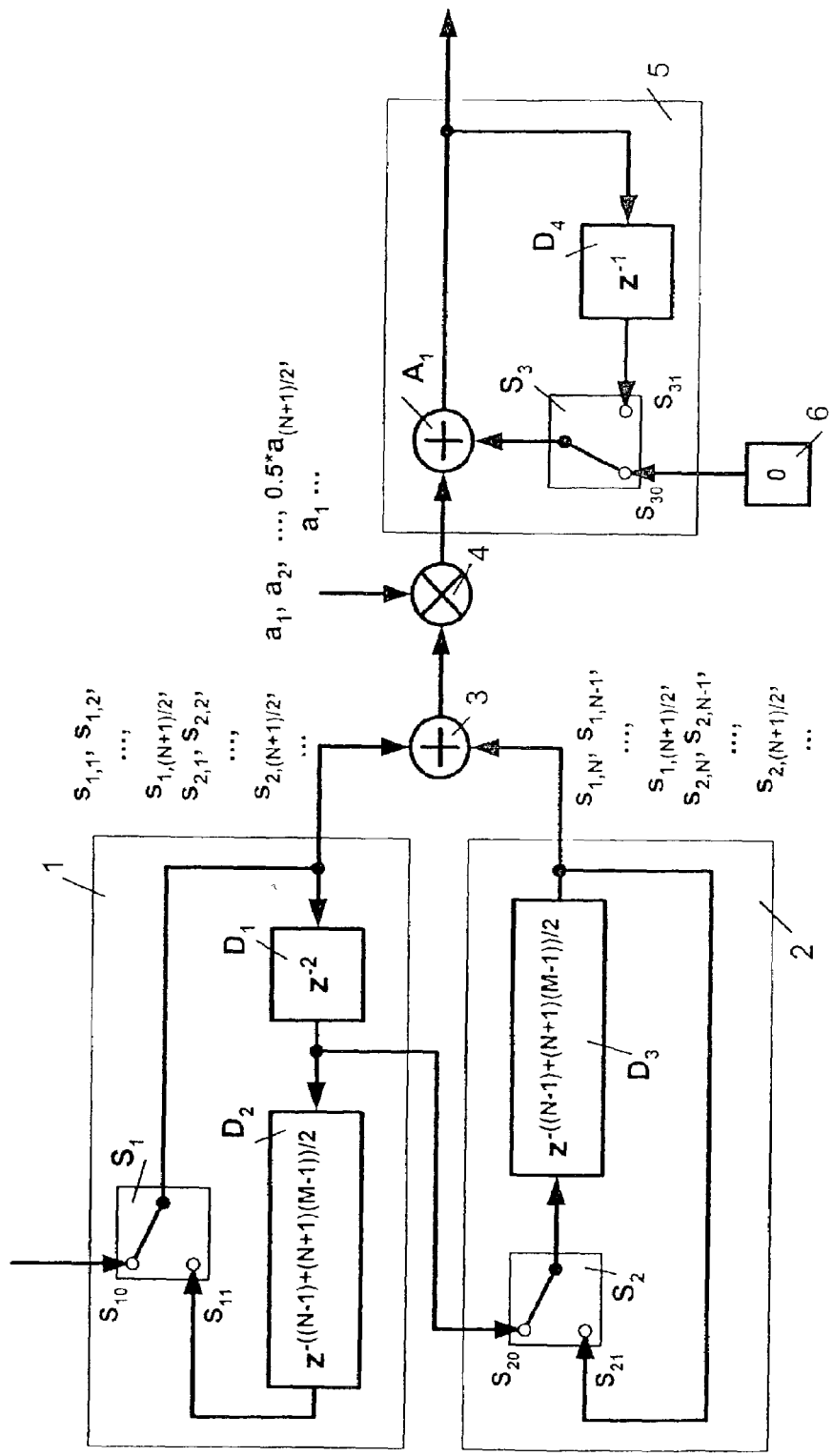
FIG. 3 shows a block diagram of a digital FIR filter structure according to the present invention for a filter of odd filter order and a M-times multiplexed input signal.

FIG. 3 shows the basically similar filter structure for a FIR filter for odd filter order N with an M-times multiplexed input signal in only the second and third delay elements have to be changed in comparison to the filter shown in FIG. 1 in that the second delay element of the first ring buffer 1 and the third delay element of the second ring buffer 2 both have a delay of $((N-1)+(N+1)(M-1))/2$ clock cycles.

Therefore, the first ring buffer 1 and the second ring buffer 2 respectively output half of the last N samples of the multiplex of the input sample currently supplied to the FIR filter.

The FIR filter according to the present invention is reduced in size, e. g. a realization with as few elements as possible, since only one multiplier is necessary because of running the filter at a higher clock rate. Further, the higher clock rate is reduced in comparison to prior art filters which are reduced in size. Therefore, the realization on an ASIC is cheaper, since only a reduced calculation power is needed for a small size filter unit.

What is claimed is:

1. A digital FIR filter of order N receiving an input signal with a predetermined sampling rate and outputting an output signal with said predetermined sampling rate, comprising:
   a combining unit having:
   a first buffer which receives the input signal and outputs each of the second half of the last N received input samples, whereby in case of odd N input samples the middle sample is doubled, of each input signal in the time inverted order of reception before a next input sample is supplied to the FIR filter,
   a second buffer which outputs each of the first half of the last N received input samples, whereby in case of odd N input samples the middle sample is doubled, of each input signal in the order of reception during the time in which the actual input sample is supplied to the FIR filter, and
   a first adder which receives and adds the same clock cycle output samples of the first and second buffer (2, 3) which have to be subjected to equal filter coefficients, and outputs a combined output signal,
   a multiplier receiving the combined output signal and multiplying each sample thereof with a respective corresponding filter coefficient, and
   an integrator receiving the multiplied samples of the combined output signal, integrating them before the next input sample is supplied to the FIR filter, and providing the actual output sample at the end of said first time period, characterized in that said buffer includes:
   a first switch receiving the input signal at a first fixed terminal and providing the output samples of the first buffer at a variable terminal thereof,
   a first delay element connected to said variable terminal of said first switch and providing delayed input samples to the second buffer, and
   a second delay element connected to the output of the first delay element and providing further delayed input samples to a second fixed terminal of said first switch, and that
   said second buffer comprises:
   a second switch receiving the delayed input samples at a first fixed terminal, and
   a third delay element connected to a variable terminal of said second switch and providing the output samples of the second buffer which are additionally supplied to a second fixed terminal of said second switch, wherein said variable terminal of said first switch and said variable terminal of said second switch are connected to the respective first signal sample and are connected to the respective second fixed terminal during a third time period to calculate and output said combined output signal.

2. The digital filter according to claim 1, wherein for even N said combining unit combines the first N/2 of the last N received input signal samples of the input signal which comprises the input sample actually supplied to the FIR filter in the order of reception with the last N/2 of the last N received input signal samples of the input signal which comprises the input sample actually supplied to the FIR filter in time inverted order of reception.

3. The digital filter according to claim 1, wherein for odd N said combining unit combines the first (N−1)/2 of the last N received input signal samples of the input signal which comprises the input sample actually supplied to the FIR filter in the order of reception with the last (N−1)/2 of the last N received input signal samples of the input signal which comprises the input sample actually supplied to the FIR filter in time inverted order of reception, and doubles the (N+1)/2 sampling value.

4. The digital filter according to claim 1, wherein the input signal inputted to the first buffer is a M-times multiplexed input signal.

5. The digital FIR filter according to claim 1, wherein said integrator comprises:
   a second adder receiving the multiplied samples of the combined output signal as respective first summands and providing the actual output sample at the end of said first time period,
   a fourth delay element receiving the output signal of said second adder, and
   a third switch which variable terminal provides respective second summands to the second adder, which receives a zero signal at a first fixed terminal and the delayed output signal of said second adder at a second fixed terminal,
   wherein said variable terminal of said third switch is connected to the first fixed terminal during a second time period for loading a new input signal sample and is connected to the respective second fixed terminal during a third time period to calculate and output said actual output sample.

6. A method to filter an input signal with a digital FIR filter of order N having a modified FIR filter of order I operating with a higher sampling rate, comprising:
   holding in a first buffer which receives the input signal and outputs each of the second half of the last N received input samples, whereby in case of odd N input samples the middle sample is doubled, of each input signal in the time inverted order of reception during the time in which the actual input sample is supplied to the FIR filter,
   holding in a second buffer which outputs each of the first half of the last N received input samples, whereby in case of odd N input samples the middle sample is doubled, of each input signal in the order of reception before the next input sample is supplied to the FIR filter, and adding in a first adder the same clock cycle output samples of the first and second buffer which have to be subjected to equal filter coefficients, and outputting a combined output signal, multiplying each sample of the combined output signal with a respective corresponding filter coefficient, and integrating the multiplied samples of the combined output signal before the next input sample is supplied to the FIR filter, and providing the actual output characterized by the steps of:

switching the input signal to the first adder and to a first delay element in the first buffer during a second time period for loading a new input signal sample;

delaying the input signal in the first delay element and providing delayed input samples;

delaying the delayed input samples in a second delay element in the first buffer;

switching first further delayed input samples outputted from the second delay element to the first adder and to the first delay element during a third time period to calculate and output said combined output signal;

switching the delayed input samples to a third delay element in the second buffer during the second time period;

delaying the delayed input samples in the third delay element and outputting second further delayed input samples to the first adder; and switching the second further delayed input samples to the input of the third delay element during the third time period.

7. The method according to claim 6, wherein for even N the first N/2 of the last N received input signal samples of the input signal which comprises the input sample actually supplied to the FIR filter in the order of reception are combined with the last N/2 of the last N received input signal samples of the input signal which comprises the input sample actually supplied to the FIR filter in time inverted order of reception.

8. The method according to claim 6, wherein for odd N the first (N−1)/2 of the last N received input signal samples of the input signal multiplex which comprises the input sample actually supplied to the FIR filter in the order of reception are combined with the last (N−1)/2 of the last N received input signal samples of the input signal which comprises the input sample actually supplied to the FIR filter in time inverted order of reception, and the (N+1)/2 sampling value is doubled.

9. The method according to claim 6, wherein the input signal is a M-times multiplexed input signal.

10. A computer readable medium including computer program instructions that cause a computer to implement a method of filtering an output signal with a digital FIR filter of order and having a modified FIR filter of order 1 operating with a higher sampling rate, the method comprising:

holding in a first buffer which receives the input signal and outputs each of the second half of the last N received input samples, whereby in case of odd N input samples the middle sample is doubled, of each input signal in the time inverted order of reception during the time in which the actual input sample is supplied to the FIR filter, holding in a second buffer which outputs each of the first half of the last N received input samples, whereby in case of odd N input samples the middle sample is doubled, of each input signal in the order of reception before the next input sample is supplied to the FIR filter, and adding in a first adder the same clock cycle output samples of the first and second buffer which have to be subjected to equal filter coefficients, and outputting a combined output signal, multiplying each sample of the combined output signal with a respective corresponding filter coefficient, and integrating the multiplied samples of the combined output signal before the next input sample is supplied to the FIR filter, and providing the actual output characterized by the steps of:

switching the input signal to the first adder and to a first delay element in the first buffer during a second time period for loading a new input signal sample;

delaying the input signal in the first delay element and providing delayed input samples;

delaying the delayed input samples in a second delay element in the first buffer;

switching first further delayed input samples outputted from the second delay element to the first adder and to the first delay element during a third time period to calculate and output said combined output signal;

switching the delayed input samples to a third delay element in the second buffer during the second time period;

delaying the delayed input samples in the third delay element and outputting second further delayed input samples to the first adder; and switching the second further delayed input samples to the input of the third delay element during the third time period.

* * * * *